US011388849B2

(12) United States Patent
Kawai et al.

(10) Patent No.: US 11,388,849 B2
(45) Date of Patent: Jul. 12, 2022

(54) COMPONENT MOUNTING MACHINE, COMPONENT SUCTIONING METHOD, NOZZLE DISPOSING METHOD AND METHOD FOR DISPOSING COMPONENT SUPPLYING DEVICE

(71) Applicant: FUJI CORPORATION, Chiryu (JP)

(72) Inventors: Hidetoshi Kawai, Anjo (JP); Jun Iisaka, Nissin (JP); Hidetoshi Ito, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 315 days.

(21) Appl. No.: 16/476,885

(22) PCT Filed: Jan. 30, 2017

(86) PCT No.: PCT/JP2017/003173
§ 371 (c)(1),
(2) Date: Jul. 10, 2019

(87) PCT Pub. No.: WO2018/138911
PCT Pub. Date: Aug. 2, 2018

(65) Prior Publication Data
US 2019/0335631 A1 Oct. 31, 2019

(51) Int. Cl.
*H05K 13/04* (2006.01)
*H05K 13/08* (2006.01)

(52) U.S. Cl.
CPC ..... *H05K 13/0408* (2013.01); *H05K 13/0411* (2018.08); *H05K 13/0417* (2013.01);
(Continued)

(58) Field of Classification Search
CPC ........... H05K 13/0408; H05K 13/0409; H05K 13/041; H05K 13/0411; H05K 13/0413;
(Continued)

(56) References Cited

U.S. PATENT DOCUMENTS

| 6,588,096 B1 * | 7/2003 | Hidese | H05K 13/041 29/832 |
|---|---|---|---|
| 2006/0112545 A1 * | 6/2006 | Hwang | H05K 13/041 29/834 |

FOREIGN PATENT DOCUMENTS

| JP | 6-278061 A | 10/1994 |
|---|---|---|
| JP | 2002-26592 A | 1/2002 |
| JP | 2003-174286 A | 6/2003 |

OTHER PUBLICATIONS

International Search Report dated Apr. 25, 2017 in PCT/JP2017/003173 filed on Jan. 30, 2017.

* cited by examiner

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

A component mounting machine includes multiple component supplying devices, a head, a head moving device, and a nozzle lifting and lowering device. The component supplying device feeds out a component to a component supply position. The head includes multiple nozzles configured to suction a component. The head moving device moves the head to cause the nozzles to face the respective component supply positions with two or more thereof. The nozzle lifting and lowering device lifts and lowers the nozzle located to face the component supply positions. In positioning the nozzles to face the respective component supply positions, the head is moved so as to prioritize a positional correction of a nozzle facing a smallest sized component over positional corrections of the other nozzles, and in this state, the nozzles facing the respective component supply positions are lifted and lowered simultaneously to suction corresponding components.

5 Claims, 10 Drawing Sheets

(52) U.S. Cl.
CPC .... *H05K 13/0812* (2018.08); *Y10T 29/53174* (2015.01); *Y10T 29/53191* (2015.01)

(58) Field of Classification Search
CPC ........... H05K 13/0417; H05K 13/0812; H05K 13/0813; H05K 13/086; Y10T 29/4913; Y10T 29/49131; Y10T 29/49137; Y10T 29/53174; Y10T 29/53178; Y10T 29/53191
See application file for complete search history.

COMPONENT MOUNTING MACHINE, COMPONENT SUCTIONING METHOD, NOZZLE DISPOSING METHOD AND METHOD FOR DISPOSING COMPONENT SUPPLYING DEVICE

TECHNICAL FIELD

This description relates to component mounting machine, component suctioning method, nozzle disposing method and method for disposing component supplying device.

BACKGROUND ART

There is known, as a component mounting machine in which components supplied from multiple feeders are suctioned and mounted on a board by multiple nozzles fitted on a rotary head. In this type of component mounting machine, there is also known a mounter in which two components are suctioned simultaneously by a pair of nozzles fitted to face each other on a rotary head (refer to, for example, Patent Literature 1).

PATENT LITERATURE

Patent Literature 1: JP-A-2003-174286

BRIEF SUMMARY

Technical Problem

However, in suctioning the two components simultaneously, the alignment of one component with the corresponding nozzle and the alignment of the other component with the corresponding nozzle cannot be executed individually. In such a case, it is considered that respective positional deviations at both the suctioned nozzles are controlled to become an average positional deviation, however, in the case of suctioning a minute component, there have been cases where such a minute component cannot be suctioned well.

This disclosure is intended to solve the problem described above, and a main object thereof is to suction multiple components including a minute component simultaneously in an ensured manner.

Solution to Problem

According to this disclosure, there is provided a component mounting machine comprising: multiple component supplying devices each configured to feed out a component to a component supply position; a head comprising multiple nozzles each configured to suction a component; a head moving device configured to move the head to cause the nozzles to face the respective component supply positions with two or more thereof; nozzle lifting and lowering devices configured to lift and lower the nozzles with facing the respective component supply positions; and a control device configured to control the head moving device and the nozzle lifting and lowering devices, wherein the control device positions the nozzles so as to face the respective component supply positions with two or more thereof, in which the control device causes the head moving device to prioritize a positional correction of a nozzle with facing a smallest sized component in the components supplied to the component supply positions with two or more thereof, and in this state, causes the nozzle lifting and lowering devices, facing the respective component supply positions with two or more thereof, to suction the respective components simultaneously.

In this component mounting machine, in positioning the nozzles in such a manner as to face the respective component supply positions with two or more thereof, the head is moved in a manner such that the positional correction of the nozzle with facing the smallest sized component is prioritized over other components to be supplied to the component supply positions with two or more thereof, and in this state, the nozzles facing the respective component supply positions with two or more thereof are lowered and lifted up simultaneously to suction the respective components. In this way, since the multiple components are suctioned simultaneously, compared with a case where components are suctioned one by one, the time spent for suctioning the components is shortened. In addition, since suctioning the components are performed simultaneously with prioritizing the positional correction of the nozzle that faces the smallest sized component having the most severe suction condition, the smallest sized component can be suctioned in an ensured manner. As for the components other than the smallest sized component, their suction conditions are not so severe as that of the smallest sized component, and hence, since a slight positional deviation may be allowable, those components can be suctioned sufficiently without giving priority to their positional corrections. Therefore, the multiple components including the minute component can be suctioned simultaneously, and this improves the productivity.

According to the disclosure, there is provided a component suctioning method for a component mounting machine, the component mounting machine comprising: multiple component supplying devices each configured to feed out a component to a component supply position; a head comprising multiple nozzles each configured to suction a component; a head moving device configured to move the head to cause the nozzles to face the respective component supply positions with two or more thereof; and nozzle lifting and lowering devices configured to lift and lower the nozzles with facing the respective component supply positions, wherein the component suctioning method comprising, positioning the nozzles so as to face the respective component supply positions with two or more thereof, in which the head is moved so as to prioritize a positional correction of a nozzle with facing a smallest sized component in the components supplied to the component supply positions with two or more thereof, and in this state, causes the nozzles, facing the respective component supply positions with two or more thereof, to suction the respective components simultaneously.

In this component suctioning method, since the multiple components are suctioned simultaneously, compared with the case where components are suctioned one by one, the time spent for suctioning the components is shortened. In addition, since suctioning the components are performed simultaneously with prioritizing the positional correction of the nozzle that faces the smallest sized component having the most severe suction condition, the smallest sized component can be suctioned in an ensured manner. As for the components other than the smallest sized component, their suction conditions are not so severe as that of the smallest sized component, and hence, since a slight positional deviation may be allowable, those components can be suctioned sufficiently without giving priority to their positional corrections. Therefore, the multiple components including the minute component can be suctioned simultaneously, and this improves the productivity.

According to the disclosure, there is provided a nozzle disposing method for a component mounting machine, the component mounting machine comprising: multiple component supplying devices each configured to feed out a component to a component supply position; a head comprising multiple nozzles each configured to suction a component; a head moving device configured to move the head to cause the nozzles to face the respective component supply positions with two or more thereof; and nozzle lifting and lowering devices configured to lift and lower the nozzles facing the respective component supply positions, wherein the nozzle disposing method comprises: in case of positioning the nozzles in such a manner as to face the respective component supply positions with two or more thereof, disposing a small nozzle in a position facing a smallest sized component in the components supplied to the respective component supply positions with two or more thereof; while disposing nozzles larger than the small nozzle in positions facing components larger than the smallest sized component in the components supplied to the component supply positions with two or more thereof.

In this nozzle disposing method, the small nozzle is disposed in the position facing the smallest sized component in the components supplied to the component supply positions with two or more thereof. Due to this, it is highly significant to give priority to the positional correction of the nozzle facing the smallest sized component having the most severe suction condition when suctioning the multiple components simultaneously.

According to the disclosure, there is provided a component supplying device disposing method for a component mounting machine, the component mounting machine comprising: multiple component supplying devices each configured to feed out a component to a component supply position; a head comprising multiple nozzles each configured to suction a component; a head moving device configured to move the head to cause the nozzles to face the respective component supply positions with two or more thereof; and nozzle lifting and lowering devices configured to lift and lower the nozzles with facing the respective component supply positions, wherein the component supplying device disposing method comprising; disposing the component supply positions with two or more thereof at same intervals as intervals at which the nozzles are disposed to face the respective component supply positions with two or more thereof; and supplying a component to one of the component supply position with two or more thereof, the component being smaller in size than components to be supplied to remaining component supply positions in the component supply positions with two or more thereof.

In this component supplying device disposing method, the intervals at which the component supply positions with two or more thereof are disposed are the same as the intervals at which the nozzles are disposed to face the respective component supply positions with two or more thereof. Due to this, two or more components are easily suctioned simultaneously. The component is supplied to one in the component supply positions with two or more thereof, the component being smaller in size than the components to be supplied to the remaining component supply positions in the component supply positions with two or more thereof. Due to this, when multiple components are suctioned simultaneously in the component mounting machine, priority can be given to the positional correction of the nozzle facing the smallest sized component having the most severe suction conditions.

DESCRIPTION OF EMBODIMENTS

Figure 1:
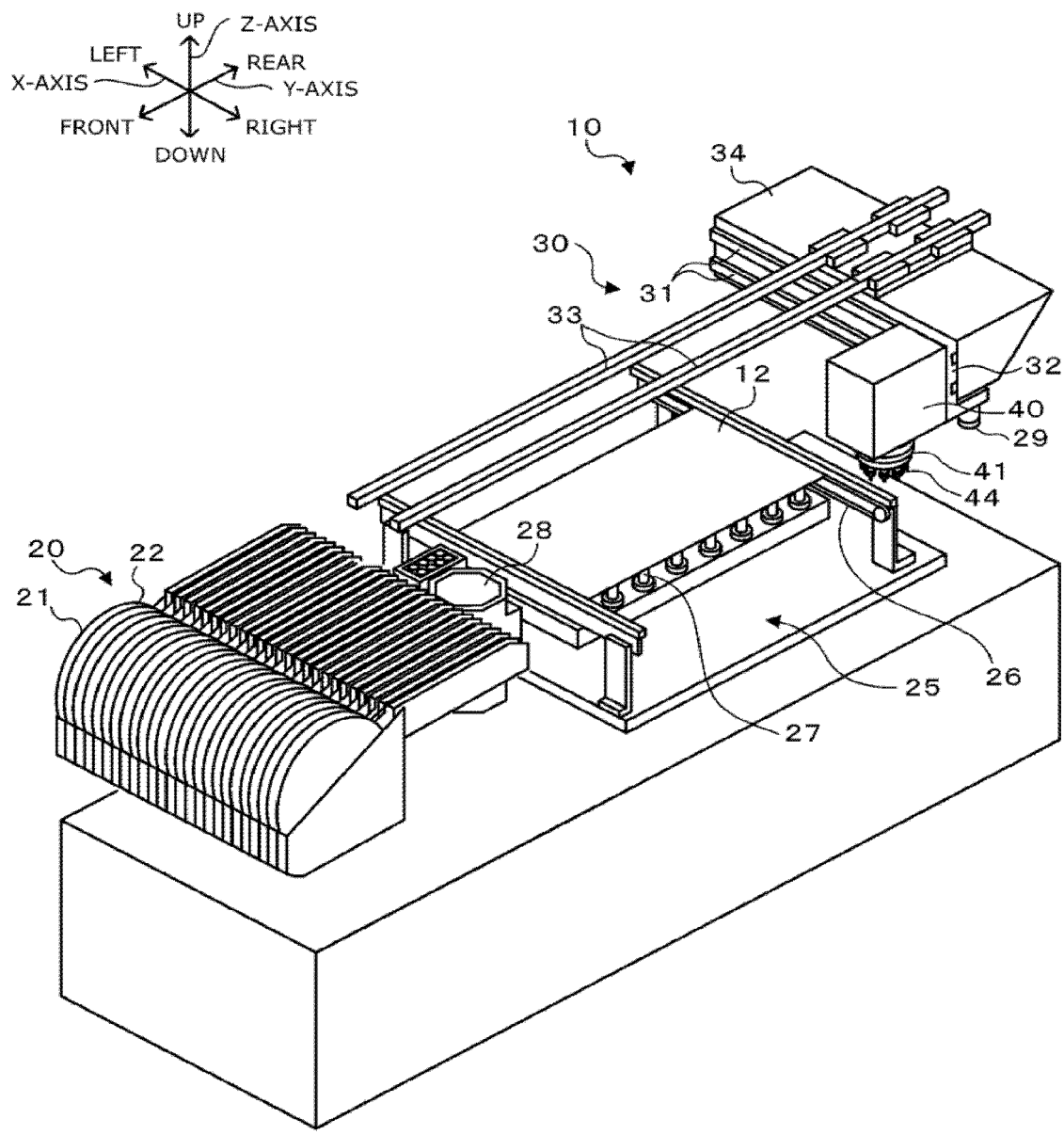
FIG. 1 is a perspective view showing a schematic configuration of component mounting machine 10.
Figure 2:
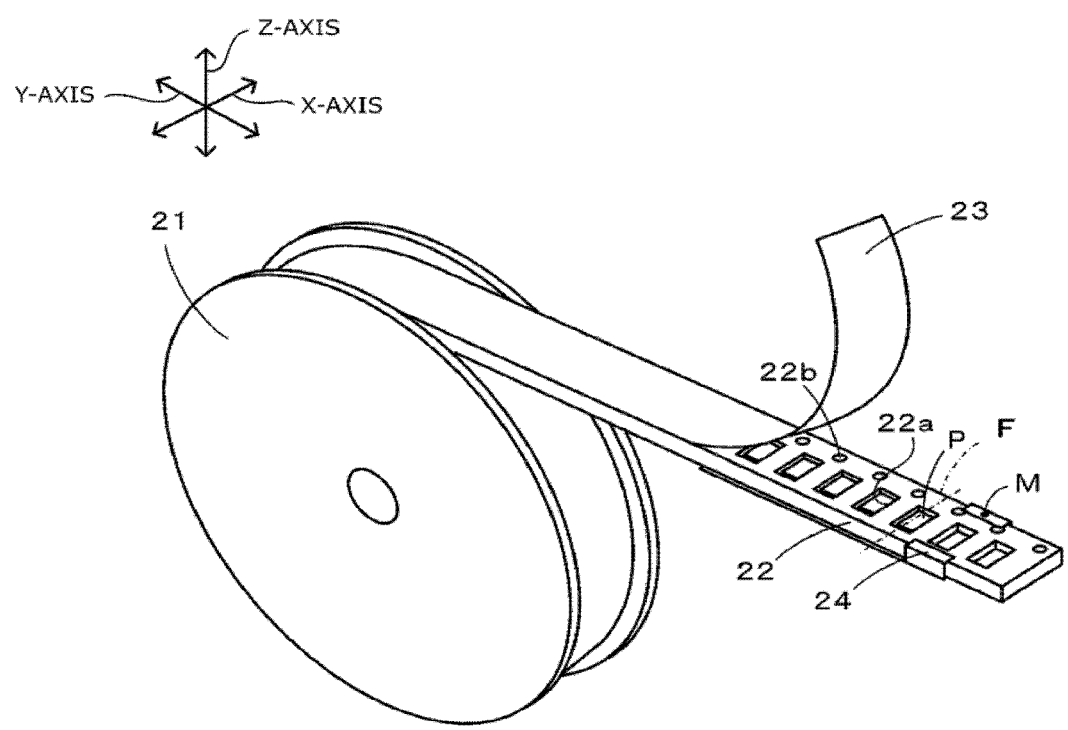
FIG. 2 is a perspective view of reel 21.
Figure 3:
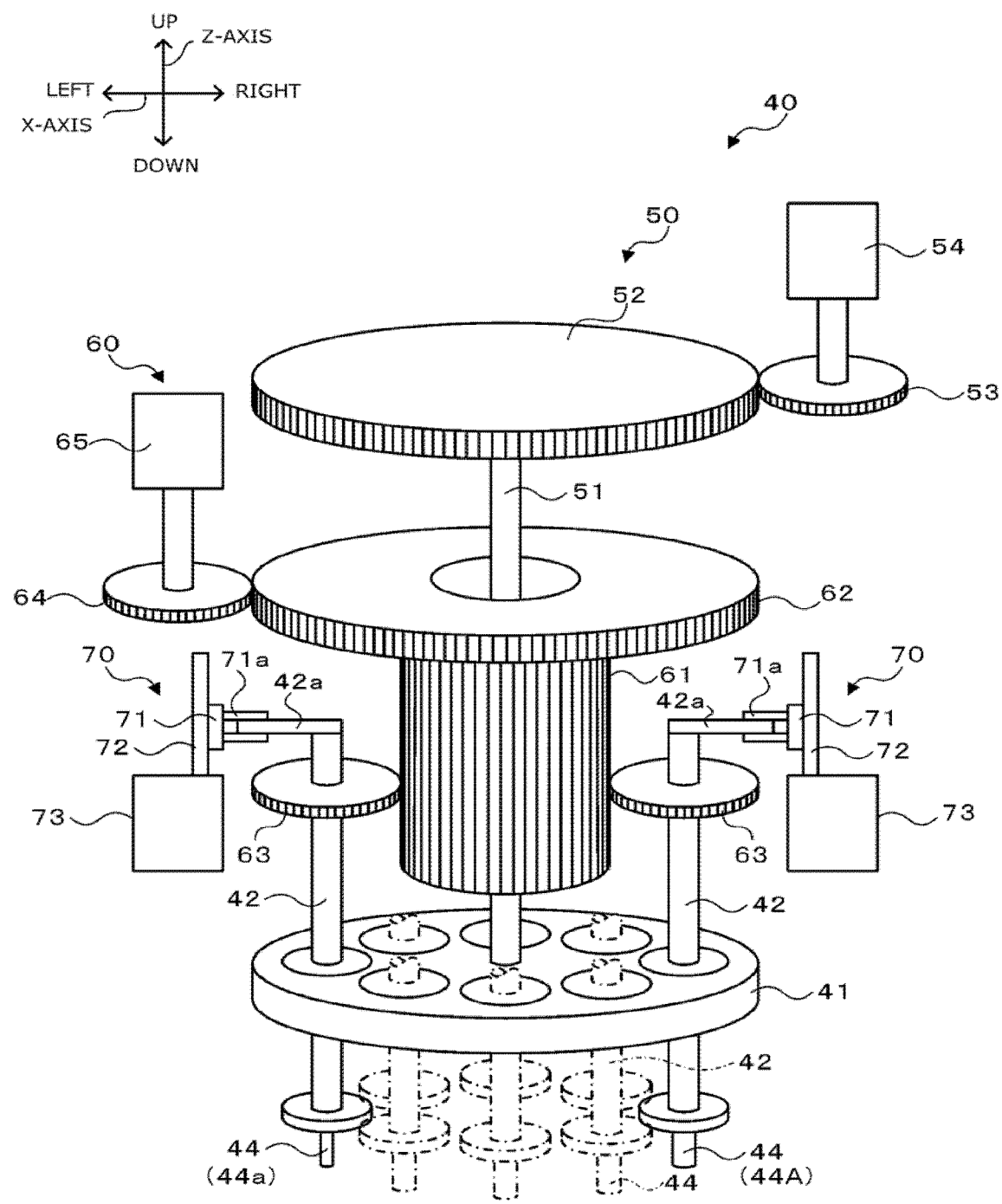
FIG. 3 is an explanatory diagram showing a schematic configuration of mounting head 40.
Figure 4:
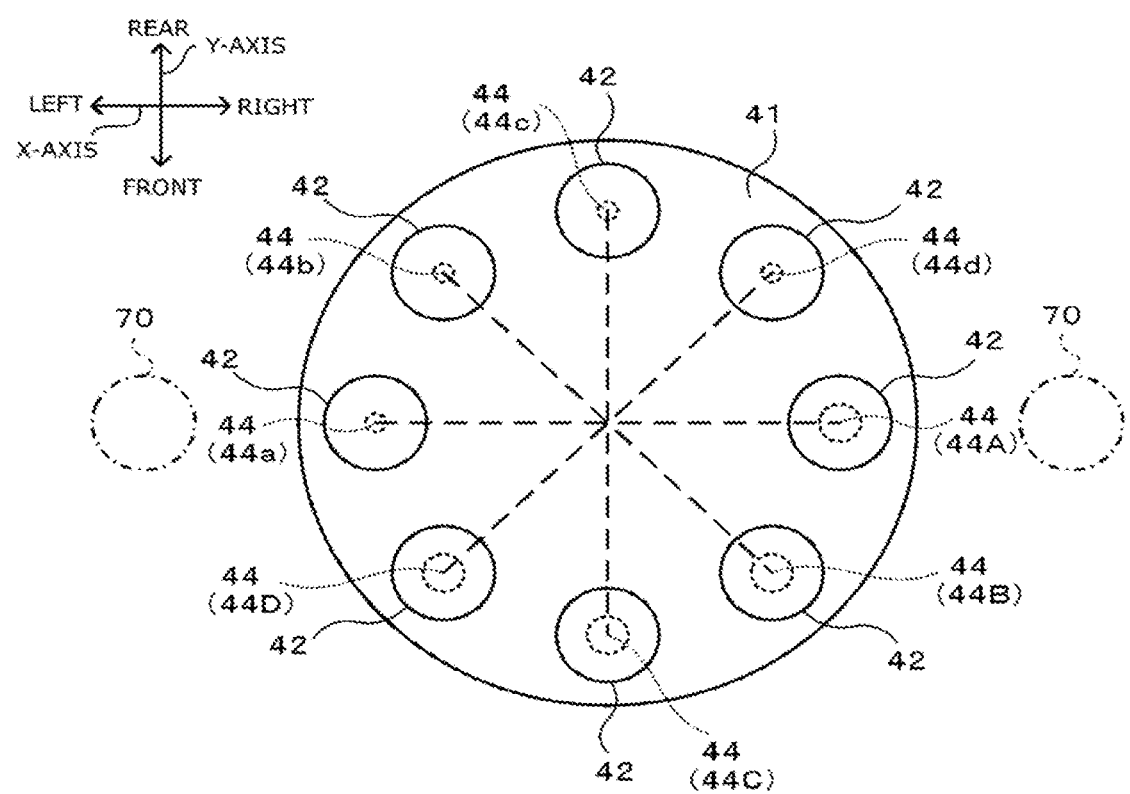
FIG. 4 is a plan view showing a schematic configuration of head main body 41.
Figure 5:
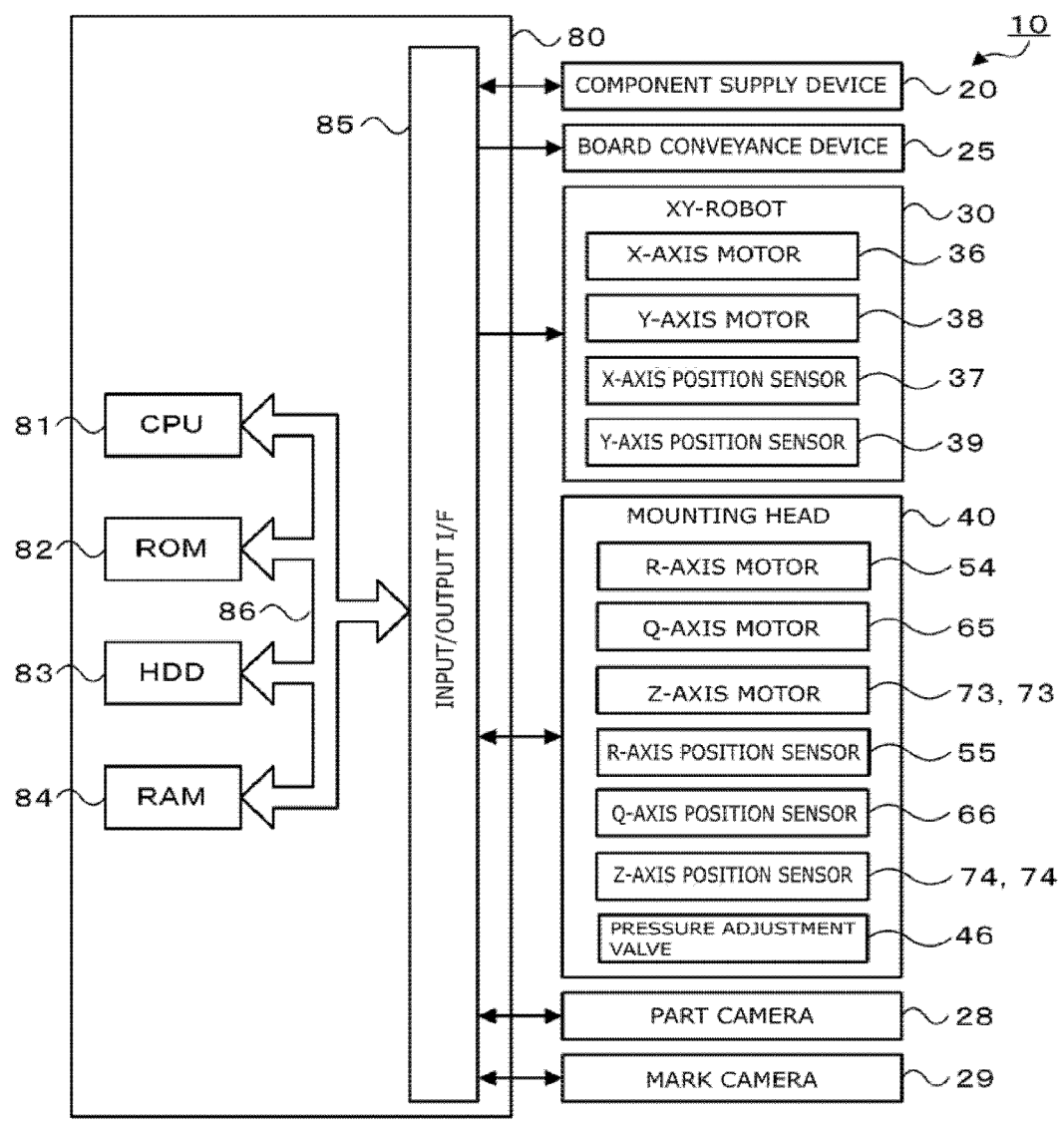
FIG. 5 is an explanatory diagram showing an electrical connecting relationship of control device 80.

Preferred embodiments of a component mounting machine of this disclosure will be described below by reference to drawings. FIG. 1 is a perspective view showing a schematic configuration of component mounting machine 10, FIG. 2 is a perspective view of reel 21, FIG. 3 is an explanatory diagram showing a schematic configuration of mounting head 40, FIG. 4 is a plan view showing a schematic configuration of head main body 41, and FIG. 5 is an explanatory diagram showing an electrical connecting relationship of control device 80. In FIG. 1, a left-right direction denotes an X-axis direction, a front (a near side)-rear (a far side) direction denotes a Y-axis direction, and an up-down direction denotes a Z-axis direction.

As shown in FIG. 1, component mounting machine 10 includes component supplying device 20, board conveyance device 25, XY-robot 30, mounting head 40, part camera 28, mark camera 29, and control device 80 (refer to FIG. 5).

Multiple component supplying devices 20 are provided at a front side of component mounting machine 10 in such a manner as to be aligned in the left-right direction (the X-axis direction). Each component supplying device 20 is configured as a tape feeder that pulls out tape 22, on which components P are installed at predetermined intervals as shown in FIG. 2, from reel 21 to feed it out at predetermined pitches. Multiple recess portions 22a are formed on tape 22 wound around reel 21 in such a manner as to be aligned along a longitudinal direction of tape 22. Each recess portion 22a installs therein component P. Components P so installed are protected by film 23 that covers a surface of tape 22. Tape 22 has sprocket holes 22b formed along the longitudinal direction thereof. Teeth of a sprocket (not shown) of component supplying device 20 fit in sprocket holes 22b, and the sprocket is rotated by a predetermined amount, whereby tape 22 is fed out at the predetermined pitches. Film 23 is peeled off to expose component P when component P arrives at predetermined component supply position F. Component supplying device 20 has tape guide 24 configured to guide tape 22 in a feeding direction. Reference mark M is affixed to a predetermined position on an upper surface of tape guide 24.

Board conveyance device 25 includes a pair of conveyor belts 26, 26 (only one of which is shown in FIG. 1), the pair of conveyer belts 26, 26 being provided in such a manner as to be spaced apart from each other in the front-rear direction while being extended across in the left-right direction. When board 12 is conveyed by conveyor belts 26, 26 to arrive at a predetermined loading position, board 12 is supported by a number of support pins 27 erected to face a rear surface of board 12.

As shown in FIG. 1, XY-robot 30 includes pair of left and right Y-axis guide rails 33, 33 provided along the front-rear direction (Y-axis direction), and Y-axis slider 34 spanning pair of left and right Y-axis guide rails 33, 33. XY-robot 30 also includes X-axis guide rails 31, 31 provided on a front surface of Y-axis slider 34 along the left-right direction (X-axis direction) and X-axis slider 32 attached to X-axis guide rails 31, 31. X-axis slider 32 is movable in the X-axis direction by driving X-axis motor 36 (refer to FIG. 5), and Y-axis slider 34 is movable in the Y-axis direction by driving Y-axis motor 38 (refer to FIG. 5). A position of X-axis slider 32 in the X-axis direction is detected by X-axis position sensor 37, and a position of Y-axis slider 34 in the Y-axis direction is detected by Y-axis position sensor 39. Mounting head 40 and mark camera 29 are attached to X-axis slider 32. Mounting head 40 and mark camera 29 are moved to any position on an XY plane by driving and controlling XY-robot 30. XY-robot 30 corresponds to a head moving device.

As shown in FIG. 3, mounting head 40 includes head main body 41, nozzle holders 42, and nozzles 44. Head main body 41 is a circular disk-like rotating body. Multiple (here, eight) nozzle holders 42 are provided at predetermined intervals in a circumferential direction of head main body 41. Nozzles 44 are individually attached to tip portions of nozzle holders 42 in a replaceable fashion. Mounting head 40 includes R-axis driving device 50, Q-axis driving device 60, and Z-axis driving devices 70, 70. In FIG. 3, as a matter of convenience in illustration, two nozzle holders 42, being located in positions to be engaged with Z-axis driving devices 70, 70, are indicated by solid lines, while remaining nozzle holders 42 are indicated by alternate long and short dashed lines. R-axis driving device 50 includes R-axis shaft 51, R-axis motor 54, and R-axis position sensor 55 (refer to FIG. 5). R-axis shaft 51 extends in the up-down direction and is attached to a central axis position of head main body 41 at a lower end thereof. R-axis motor 54 rotationally drives gear 53 meshing with R-axis gear 52 provided at an upper end of R-axis shaft 51. R-axis position sensor 55 detects a rotational position of R-axis motor 54. R-axis driving device 50 rotationally drives R-axis shaft 51 via gear 53 and R-axis 52 by driving R-axis motor 54 to thereby rotate (revolve) multiple nozzle holders 42 supported by head main body 41 in a circumferential direction together with multiple nozzles 44. That is, nozzles 44 intermittently rotate at predetermined intervals.

Q-axis driving device 60 includes two upper and lower Q-axis gears 61, 62, gears 63, 64, Q-axis motor 65, and Q-axis position sensor 66 (refer to FIG. 5). Two upper and lower Q-axis gears 61, 62 are provided in such a manner that R-axis shaft 51 is inserted coaxially and rotatably through two upper and lower Q-axis gears 61, 62. Gear 63 is provided at an upper portion of each nozzle holder 42 and meshes with lower Q-axis gear 61 slidably in the up-down direction. Q-axis motor 65 rotationally drives gear 64 meshing with upper Q-axis gear 62. Q-axis position sensor 66 detects a rotational position of Q-axis motor 65. Q-axis driving device 60 rotationally drives Q-axis gears 61, 62 by Q-axis motor 65 to thereby rotate gears 63 meshing with Q-axis gear 61 and rotates individual nozzle holders 42 around on their own center axes in the same rotational direction by the same rotation amount. Along with this, nozzles 44 also rotate (around their own center axes).

Z-axis driving devices 70, 70 are provided at two locations on a turning (revolving) track of nozzle holders 42 and individually lift up and lower nozzle holders 42 at the two locations. In this embodiment, Z-axis driving devices 70, 70 are provided in such a manner as to oppositely face each other across the center of head main body 41 in the left-right direction. Each Z-axis driving device 70 includes Z-axis slider 71, Z-axis motor 73, and Z-axis position sensor 74 (refer to FIG. 5). Z-axis slider 71 is attached to ball screw 72 extending in the up-down direction in such a manner as to be lifted up and lowered. Z-axis slider 71 includes clamping section 71a configured hold engagement piece 42a extending laterally from nozzle holder 42. Z-axis motor 73 rotates ball screw 72 to thereby lift up and lower Z-axis slider 71. Z-axis position sensor 74 detects a position of Z-axis slider 73 when Z-axis slider 73 is lifted up or lowered. Z-axis driving device 70 drives Z-axis motor 73 to lift up and lower Z-axis slider 71 along ball screw 72 to thereby lift up and lower nozzle holder 42 integrated with Z-axis slider 71 and corresponding nozzle 44. When nozzle holder 42 rotates together with head main body 41 and stops at the location where Z-axis driving device 70 is disposed, engagement piece 42a of nozzle holder 42 is held by holding section 71a of Z-axis slider 71. When nozzle holder 42 moves from the location where Z-axis driving device 70 is disposed, engagement piece 42 a of nozzle holder 42 in question is dislocated from holding portion 71a of Z-axis slider 71. Z-axis driving devices 70, 70 correspond to nozzle lifting and lowering devices.

Nozzle 44 suctions component P when a negative pressure is supplied thereto by way of pressure adjustment valve 46 (refer to FIG. 5) and releases component P suctioned when the atmospheric pressure or a positive pressure is supplied thereto. As shown in FIG. 4, a suction port of nozzle 44 is circular. Two nozzles 44, 44 diametrically facing each other across the center of head main body 41 belong to the same set. Since two nozzles 44, 44 belonging to the same set simultaneously stop at the locations where Z-axis driving devices 70, 70 are disposed, two nozzles 44, 44 in question can be lifted up and lowered altogether in the Z-axis direction. In this embodiment, there are four sets of nozzles 44, 44. Nozzles 44a and 44A belong to a first set, nozzles 44b and 44B belong to a second set, nozzles 44c and 44C belong to a third set, and nozzles 44d and 44D belong to a fourth set. A nozzle diameter of nozzles 44a to 44d are smaller than a nozzle diameter of nozzles 44A to 44D. When nozzles 44a to 44d are referred to as a whole, they are referred to as nozzles 44k, while nozzles 44A to 44D are referred to as a whole, they are referred to as nozzles K, and nozzle 44k and nozzle K belong to the same set.

As shown in FIG. 1, part camera 28 is provided between component supplying devices 20 and board conveyance device 25. Part camera 28 images a posture of component P suctioned by nozzle 44.

Mark camera 29 is provided on a lower surface of X-axis slider 32. Mark camera 29 images reference mark M applied to tape guide 24 (refer to FIG. 2) to guide tape 22 fed out from reel 21 of component supplying device 20.

As shown in FIG. 5, control device 80 is configured as a microprocessor made up mainly of CPU81 and includes ROM82, HDD83, RAM84, input/output interface 85, and the like, in addition to CPU81. These constituent elements are connected to one another via bus 86. Detection signals from XY-robot 30 (X-axis position sensor 37 and Y-axis position sensor 39), detection signals from mounting head 40 (R-axis position sensor 55, Q-axis position sensor 66, and Z-axis position sensors 74, 74), an image signal from part camera 28, an image signal from mark camera 29, and the like are inputted into control device 80 by way of input/output interface 85. Control device 80 outputs by way of input/output interface 85 a control signal to component supplying device 20, a control signal to board conveyance device 25, control signals to XY-robot 30 (X-axis motor 36 and the Y-axis motor 38), control signals to mounting head 40 (R-axis motor 54, Q-axis motor 65, Z-axis motors 73, 73), a control signal to pressure adjustment valve 46, a control signal to part camera 28, a control signal to mark camera 29, and the like.

Next, an operation of component mounting machine 10 when component mounting machine mounts components will be described. CPU81 of control device 80 controls the constituent sections of component mounting machine 10 based on a production program it receives from a management device, not shown, to produce board 12 on which multiple components are mounted. Specifically, CPU 81 executes a positional correction on nozzles 44 facing components P supplied from component supplying devices 20 and thereafter controls the individual constituent sections of component mounting machine 10, causing nozzles 44 to suction components P and nozzles 44 now holding components P to mount components P on board 12 subsequently.

Here, the positional correction executed on nozzle 44 facing component P supplied by component supplying device 20 will be described. Let's assume that a positional deviation based on a tolerance or the like of nozzle 44 is resolved by executing a calibration in advance. CPU81 causes mark camera 29 to image reference mark M applied to tape guide 24 of component supplying device 20 and recognizes a coordinate position of reference mark M on component mounting machine 10 from the captured image. In component mounting machine 10, a distance over which a center position of component P (a position where component P is suctioned) lies away from reference mark M is determined in advance and is stored in HDD83. Due to this, CPU81 can obtain a coordinate position of the center position of component P on component mounting machine 10 from the coordinate position of reference mark M on component mounting machine 10. CPU81 executes a positional correction on nozzle 44 so that the center position of nozzles 44 coincides with the center position of component P. As a result, a positional deviation based on the tolerance or the like of reference mark M on tape guide 24 can be eliminated, and the center position of nozzle 44 is allowed to coincide with the center position of component P with good accuracy, whereby component P can be suctioned by nozzle 44 in an ensured fashion.

Figure 6:
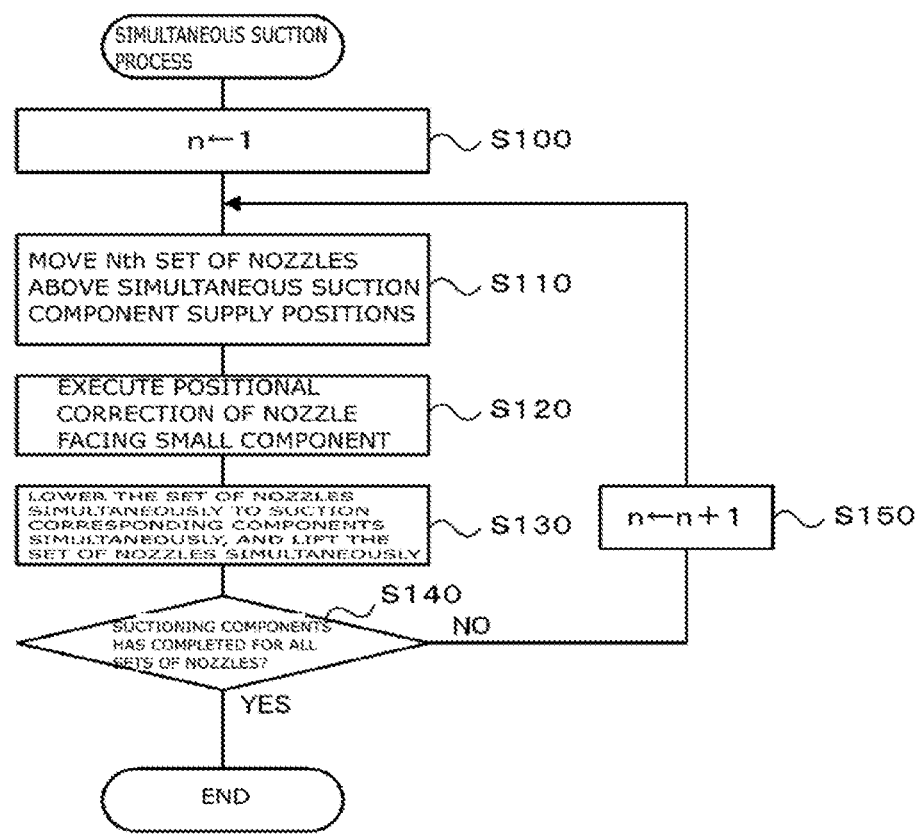
FIG. 6 is a flowchart showing an example of a simultaneous suction process.
Figure 7:
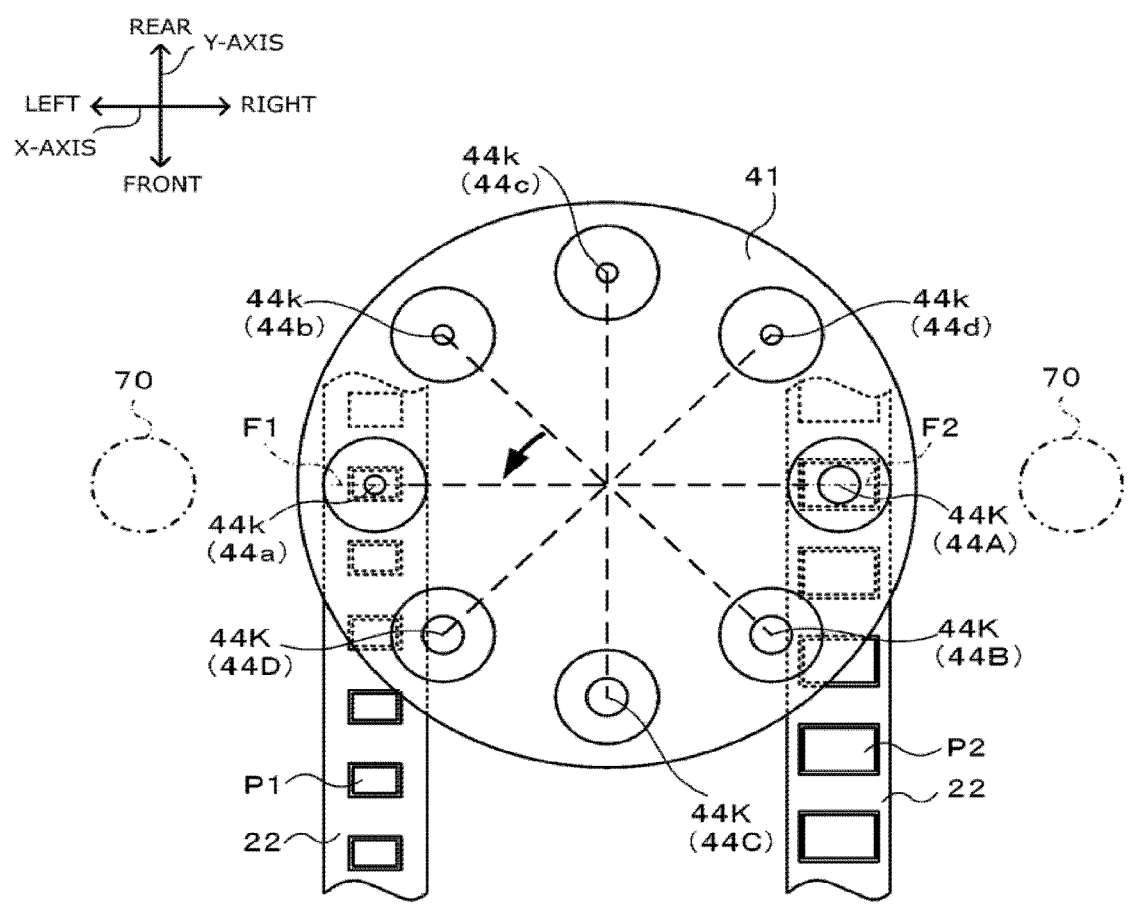
FIG. 7 is an explanatory showing illustrating a positional relationship between nozzle 44 and tape 22.

Next, a case will be described where in suctioning component P with nozzle 44, components P are suctioned simultaneously by the same set of nozzles 44*k*, 44K. In this case, CPU81 executes a simultaneous suction shown in FIG. 6. Here, as shown in FIG. 7, assumption may be made such that components to be suctioned by nozzle 44*k* are all components P1 of the same small size (for example, a rectangular component of 0.4 mm×0.2 mm in plan view), while components to be suctioned by nozzle 44K are all components P2 of the same large size (for example, a rectangular component of 1.0 mm×0.5 mm in plan view). Nozzle 44*k* is a small-sized nozzle suitable for component P 1, and nozzle 44K is a large-sized nozzle suitable for component P 2. Reel 21 of component supplying device 20 is set so that component P1 is supplied to a position facing nozzle 44*k* and component P2 is supplied to a position facing nozzle 44K. Since components to be suctioned simultaneously are the two types of component P1 and component P2, component P1 constitutes a smallest sized component. Component supply position for component P1 is referred to as component supply position F1, and component supply position F for component P2 is referred to as component supply position F2.

When starting a simultaneous suction processing routine, CPU81 first substitutes a value 1 in variable n (S100). Subsequently, CPU81 causes the individual constituent sections of component mounting machine 10 to operate so that an nth set of nozzles 44*k*, 44K, which makes a pair, are disposed to stay above component supply positions F1, F2, respectively (S110). Now, since the variable n takes the value of 1, a target nozzle set is a first set of nozzles 44*a*, 44A. Due to this, CPU81 causes the individual constituent sections of component mounting machine 10 to operate so that nozzle 44*a* faces component P1 positioned in component supply position F1 and that nozzle 44A faces component P 2 positioned in component supply position F2 (refer to FIG. 7). As a result, nozzle 44*a* can be lifted up and lowered by left Z-axis driving device 70, while nozzle 44K can be lifted up and lowered by right Z-axis driving device 70.

Next, CPU81 executes positional corrections by giving priority to a positional correction of nozzle 44*k* facing component P1 over a positional correction of nozzle 44K facing component P2 (S120). The positional correction of nozzle 44*k* facing component P1 has already been described.

Figure 8:
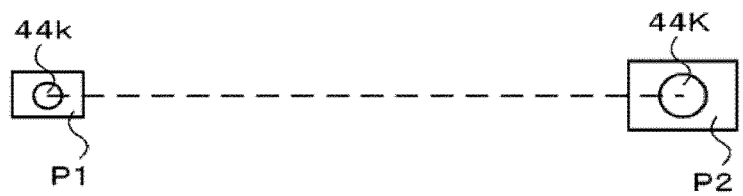
FIG. 8 is an explanatory diagram showing a positional relationship between nozzles 44k, 44K and components P1, P2.

For example, with no positional deviation of reference mark M occurring on component P1's side and no positional deviation of reference mark M occurring on component P2's side, a positional relationship of component P1 with nozzle 44*k* and a positional relationship of component P2 with nozzle 44K become those shown in FIG. 8. That is, the center position of nozzle 44*k* coincides with the center position of component P1, and the center position of nozzle 44K coincides with the center position of component P2.

Figure 9:
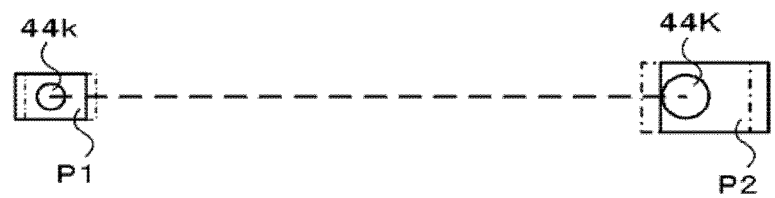
FIG. 9 is an explanatory diagram showing a positional relationship between nozzles 44k, 44K and components P1, P2.

On the other hand, with a positional deviation of reference mark M occurring on component P1's side and a positional deviation of reference mark M occurring on component P2's side, in which the position of component P1 deviates leftwards of a designed position (an alternate long and short dashed line in FIG. 9) and the position of component 2 deviates rightwards of a designed position (an alternate long and short dashed line in FIG. 9), when a positional correction is executed with prioritizing the positional correction of nozzle 44*k* facing component P1 as executed in S120, a positional relationship of component P1 with nozzle 44*k* and a positional relationship of component P2 with nozzle 44K become those as shown in FIG. 9. That is, while the center position of nozzle 44*k* coincides with the center position of component P1, the center position of nozzle 44K does not coincide with the center position of component P2. However, since component P2 is larger in size than component P1, a suction permissible range of component P2 becomes wide. Therefore, even though the center position of nozzle 44K does not coincide with the center position of component P2, nozzle 44K can suction component P 2 without any problem.

Figure 10:
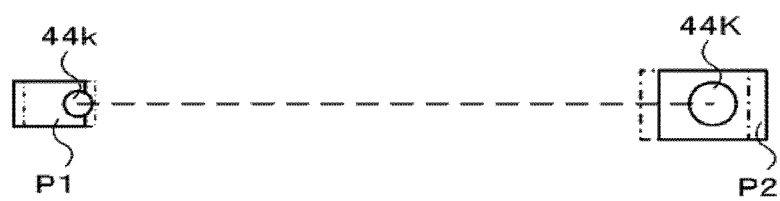
FIG. 10 is an explanatory diagram showing a positional relationship between nozzles 44k, 44K and components P1, P 2.

In this regard, similarly, with the position of component P1 deviating leftwards of the designed position (an alternate long and short dashed line in FIG. 10) and the position of component 2 deviating rightwards of the designed position (an alternate long and short dashed line in FIG. 10), when a positional correction is executed with prioritizing the positional correction of nozzle 44A facing component P2, a positional relationship of component P1 with nozzle 44k and a positional relationship of component P2 with nozzle 44K become those as shown in FIG. 10. That is, while the center position of the nozzle 44K coincides with the center position of component P 2, the center position of nozzle 44k does not coincide with the center position of component P1. In this case, since component P 1 is smaller in size than component P 2, a suction permissible range of component P 1 becomes narrow. Therefore, nozzle 44k may protrude from component P 1, whereby nozzle 44K may not be able to suction component P 1.

Now, after S120, CPU81 causes both left and right Z-axis driving devices 70, 70 to simultaneously lower two nozzles 44k, 44K that belong to an nth set, causes two nozzles 44k, 44K to suction corresponding components, and causes left and right Z-axis driving devices 70, 70 to lift up two nozzles 44k, 44K (S130). Due to this, the time required to suction components is shortened, compared with a case where component P1 is suctioned after a positional correction is executed on component P1, and subsequently, component P2 is suctioned after a positional correction is executed on component P2.

Thereafter, CPU81 determines whether suctioning the components has completed for all the sets of nozzles 44k, 44K as planned (S140), and if CPU 81 determines that the suctioning of planned components has not yet been finished, CPU 81 increases the value of the variable n in increments of one (S150) and returns to S110. In S110, CPU81 feeds out tapes 22 and disposes for next components P1, P2 to be disposed in component supply positions F1, F2, respectively. CPU81 rotates head main body 41 counterclockwise (refer to an arrow in FIG. 7) by a predetermined angle (45°) when viewed from above to thereby cause the next set of nozzles 44k, 44K to face components P1, P2, respectively. Thereafter, CPU81 executes the processes from S120 on.

On the other hand, if CPU 81 determines in S140 that all the sets of nozzles 44k, 44K have finished suctioning the components as planned, CPU 81 ends the simultaneous suction process.

Thereafter, CPU81 moves mounting head 40 to lie above part camera 28, and components P1, P 2 suctioned and held to nozzles 44 are imaged subsequently by part camera 28. Then, CPU 81 recognizes postures of components P1, P2 based on the captured images and causes components P1, P2 to be mounted on board 12 by taking the postures in consideration.

With component mounting machine 10 described above, since two components P1, P2 are suctioned simultaneously, the time required to suction the components is shortened, compared with a case where components P1, P2 are suctioned one by one. In addition, in suctioning components P1, P2 simultaneously, since priority is given to the positional correction of nozzle 44k facing component P1, which is smaller in size and which hence has the severer suction condition, over the positional correction of nozzle 44K facing component P2, smaller component P1 can be suctioned in an ensured fashion. For component P2 that is larger in size, since component P2 has the suction condition that is not so sever as that of smaller component P1, permitting the slight positional deviation, component P2 can be suctioned well enough without giving priority to the positional correction of nozzle 44K facing component 2. Consequently, multiple components including component P1 that is smaller in size can be suctioned simultaneously in an ensured fashion, and hence, the productivity is improved.

In addition, since the center position of nozzle 44k is caused to coincide with the center position of component P1 smaller in size, component P1 smaller in size can be suctioned in a more ensured fashion.

Further, since the simultaneous suction process is executed on the multiple (four) sets of nozzles 44k, 44K of mounting head 40, the number of times mounting head 40 moves between component supplying device 20 and board 12 is reduced, compared with a case where the simultaneous suction process is executed only on one nozzle set of mounting head 40.

Furthermore, since the rotary head including the multiple (eight) nozzles 44 that are disposed on the circumference and rotating intermittently is adopted as mounting head 40, the head can be made compact in size, compared with a case where an in-line head is used in which multiple nozzles are disposed into a straight line.

In addition, since nozzles 44k, 44K facing two component supply positions F1, F2, respectively, are aligned in a direction at right angles to the direction in which component supplying devices 20 feed out components P1, P2, the actions of feeding out components P1, P2 and the subsequent actions of suctioning components P1, P2 can easily be executed repeatedly.

Further, since the small-sized nozzle 44k is disposed in the position facing smaller component P1 of components P1, P2 that are supplied to two component supply positions F1, F2, respectively, it is highly significant to give priority to the positional correction of nozzle 44k facing component P1.

Furthermore, the interval between two component supply positions F1, F2 is the same as the interval between nozzles 44k, 44K that face two component supply positions F1, F2, respectively. Due to this, two components can easily be suctioned simultaneously. Component P1 smaller in size than the other component is supplied to one of two component supply positions F1, F2. Due to this, in suctioning components simultaneously, component mounting machine 10 can give priority to the positional correction of nozzle 44k facing smallest sized component P1 having the severest suction condition.

The present disclosure is not limited in any way to the embodiment described heretofore, and hence, needless to say, the present disclosure can be carried out in various modes without departing from the technical scope thereof.

Figure 11:
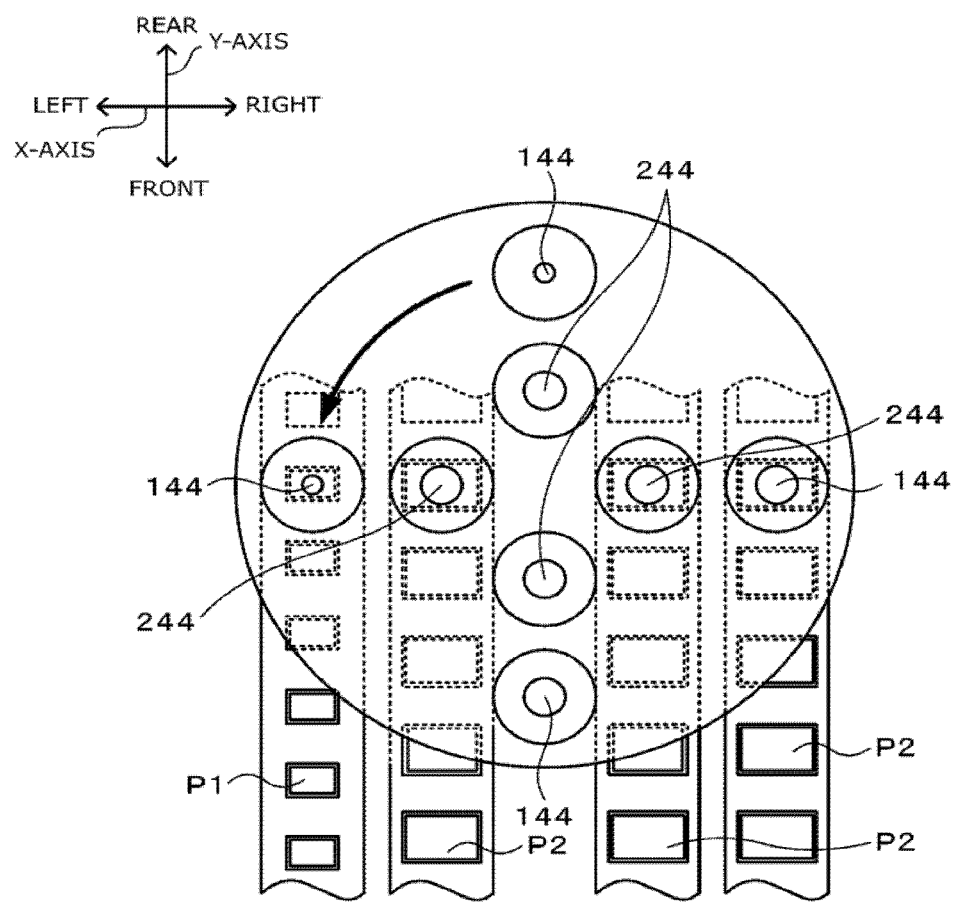
FIG. 11 is an explanatory diagram of another embodiment.

For example, in the embodiment described above, while the rotary head is described as including eight nozzles 44 that are disposed at the predetermined intervals on the same circumference, the number of nozzles 44 is not limited to eight, and hence, for example, 12, 20, or 24 nozzles may be disposed in that way. As shown in FIG. 11, a rotary head may be used in which multiple (four) nozzles 144, 244 are disposed on each of outer and inner circumferences. This rotary head include four nozzles 144 that are disposed at predetermined intervals on an outer circumference and four nozzles 244 that are disposed at predetermined intervals on an inner circumference. In addition, outer nozzle 144, inner nozzle 244, inner nozzle 244, and outer nozzle 144 are disposed into a row on a lower surface of the head in a diametrical direction thereof. Four nozzles 144, 244, 244, 144 that are aligned in the diametrical direction extending laterally face components P1, P2, P2, P2, respectively, and can be individually lifted up and lowered by corresponding Z-axis driving devices, not shown. In addition, in four nozzles 144, 244, 244, 144 that are disposed in the diametrical direction extending laterally, one nozzle (here, nozzle 144 at a left end) suctions small-sized component P1 and the remaining nozzles suction large-sized components P2 simultaneously. In this case, too, by giving priority to the positional correction of nozzle 144 facing small-sized component P1, the same advantageous effect as that obtained by the embodiment described above can be obtained. Three components P2 may have the same size or different sizes as long as they are larger in size than component P1.

Figure 12:
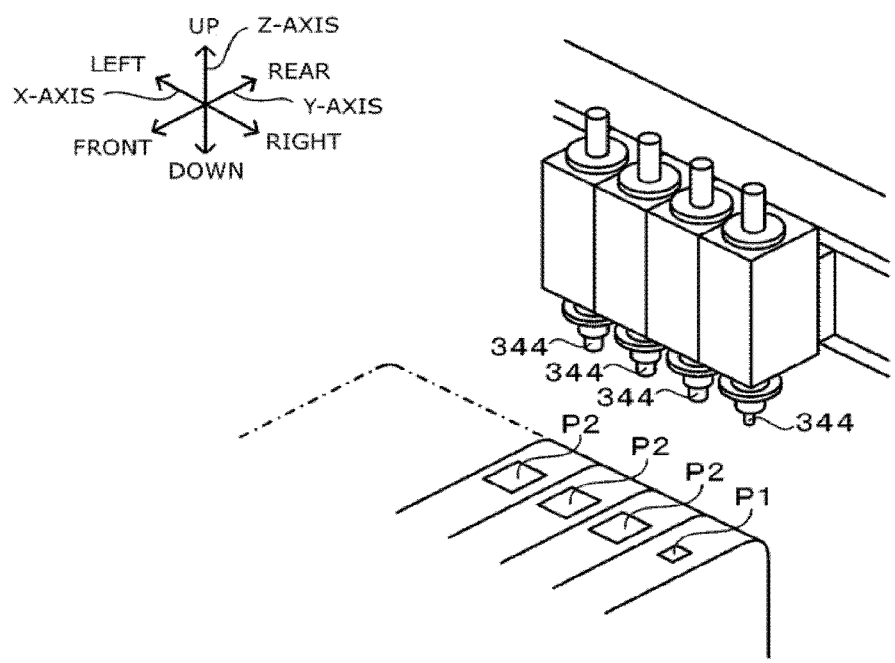
FIG. 12 is an explanatory diagram of a further embodiment.

In the embodiment described above, while mounting head 40 is described as being made up of the rotary head, as shown in FIG. 12, an in-line head may be used in which multiple nozzles 344 are aligned on a straight line extending in the left-right direction. In FIG. 12, in multiple nozzles 344, one (here, nozzle 344 at a right end) suctions small-sized component P1, while the remaining nozzles suction large-sized components P2, and all nozzles 344 can be lifted up and lowered simultaneously. In this case, too, by giving priority to the positional correction of nozzle 344 facing small-sized component P1, the same advantageous effect as that obtained by the embodiment described above can be obtained. Three components P2 may have the same size or different sizes as long as they are larger in size than component P1.

In the embodiment described above, nozzles 44a to 44d may suction four small components P1a to P1d having different sizes, and nozzles 44A to 44D may suction four large components P1A to P1D having different sizes. In this case, small components P1a to P1d and large components NA to P1D are supplied by different tapes. Small component P1a is smaller in size than large component P1A, and an interval between a component supply position of small component P1a and a component supply position of large component NA is the same as an interval between nozzle P1a and nozzle P1A. When small component P1a and large component P1A are suctioned simultaneously, priority is given to a positional correction of nozzle 44a facing small component P1a. The same also applies to other small components P1b to P1d and large components P1B to P1D. In this way, the same advantageous effect as that obtained by the embodiment described above can be obtained.

In the embodiment described above, in executing a positional correction between component P and nozzle 44 facing the component, the coordinate position of the center position of component P on component mounting machine 10 is recognized from the captured image of reference mark M; however, sprocket hole 22b may be made use of in place of reference mark M, or the coordinate position of the center position of component P on component mounting machine 10 may be recognized from a captured image of component P resulting from imaging component P in question with mark camera 29.

In the embodiment described above, while Z-axis motor 73 lifts up and lowers Z-axis slider 71 using ball screw 72, Z-axis slider 71 may also be lifted up and lowered using a linear motor. In addition, Z-axis slider 71 may be lifted up and lowered using an actuator such as an air cylinder, in place of Z-axis motor 73.

In the embodiment described above, while the suction port of nozzle 44 is circular, depending on shapes of components P, the suction hole may be square, rectangular, V-shaped, or the like.

In the embodiment described above, another tape may be set between tape 22 for supplying small-sized components P1 and tape 22 for supplying large-sized components P2.

In the embodiment described above, while mounting head 40 is adopted which has the multiple sets of nozzle 44k and nozzle 44K, the configuration is not limited to the multiple sets of nozzle 44k and nozzle 44K, and hence, mounting head 40 may include only one set of nozzle 44k and nozzle 44K.

The component mounting machine of this disclosure may be configured as follows.

In the component mounting machine of this disclosure, in controlling the head moving device so that priority is given to the positional correction of the nozzle facing the smallest sized component over the positional corrections of the other nozzles, the control device may control the head moving device so that the predetermined suction position of the nozzle facing the smallest sized component coincides with the predetermined suctioned position of the smallest sized component. As a result, the smallest sized component can be suctioned in a more ensured manner.

In the component mounting machine of this disclosure, wherein the head comprises multiple sets of the nozzles facing the respective component supply positions with two or more thereof, and wherein the control device positions the nozzles, for each set, so as to face the respective component supply positions with two or more thereof, in which the control device causes the head moving device to prioritize a positional correction of a nozzle with facing a smallest sized component in the components supplied to the component supply positions with two or more thereof, and in this state, causes the nozzle lifting and lowering devices, facing the respective component supply positions with two or more thereof, to suction the respective components simultaneously. As a result, since the simultaneous suctioning is executed on the multiple sets of nozzles, the number of times the mounting head moves between the component supplying device and the board is reduced, compared with a case where the simultaneous suctioning is executed only on one set of nozzles.

In the component mounting machine of this disclosure, the head may be the rotary head in which the multiple nozzles are disposed on the circumference and which is intermittently rotated or may be the in-line head in which the multiple nozzles are disposed on the straight line. However, the head may be made more compact in size with the rotary head than with the in-line head.

In the component mounting machine of this disclosure, the nozzles with facing the respective component supply positions with two or more thereof may be aligned in the direction at right angles to the direction in which the component supplying device feeds out the component. As a result, the component feeding action and the subsequent simultaneous suctioning are easily executed repeatedly.

INDUSTRIAL APPLICABILITY

The present disclosure can be applied to various industries where components are mounted on boards.

REFERENCE SIGNS LIST 10 component mounting machine, 12—board, 20 component supplying device, 21—reel, 22—tape, 22a recess portion, 22b sprocket hole, 23 film, 24—tape guide, 25—board conveyance device, 26 conveyor belt, 27 support pin, 28—part camera, 29—mark camera, 30 XY-robot, 31 X-axis guide rail, 32 X-axis slider, 33-Y-axis guide rail, 34 Y-axis slider, 36—X-axis motor, 37 X-axis position sensor, 38—Y-axis motor, 39 Y-axis position sensor, 40—mounting head, 41—head main body, 42—nozzle holder, 42a engagement piece, 44, 44a to 44d, 44k, 44A to 44D, 44k nozzle, 46 pressure adjustment valve, 50 R-axis driving device, 51

R-axis shaft, 52 R-axis gear, 53 gear, 54 R-axis motor, 55 R-axis position sensor, 60 Q-axis driving device, 61 Q-axis gear, 62 Q-axis gear, 63,64 gear, 65 Q-axis motor, 66 Q-axis position sensor, 70 Z-axis driving device, 71 Z-axis slider, 71a holding section, 72—ball screw, 73 Z-axis slider, 73 Z-axis motor, 74 Z-axis position sensor, 80 control device, 81 CPU, 82 ROM, 83 HDD, 84 RAM, 85 I/O interface, 86 bus, 144, 244, 344 nozzle, F, F1, F2 component supply position, P, P1, P2 component.

The invention claimed is:

1. A component mounting machine comprising:
   multiple component supplying devices each configured to feed out a component to a component supply position;
   a head comprising multiple nozzles each configured to suction a component, the nozzles disposed on a circumference of the head which is intermittently rotated;
   a head moving robot configured to move the head to cause the nozzles to face the respective component supply positions;
   a camera on the head moving robot movable with the head;
   nozzle lifting and lowering devices each including a motor configured to lift and lower the nozzles facing the respective component supply positions; and
   processing circuitry configured to:
   control the head moving robot and the nozzle lifting and lowering devices,
   position the multiple nozzles so as to face the respective component supply positions with two or more thereof,
   image a reference mark of each of the multiple component supplying devices with the camera,
   determine a coordinate position of a center of the component of each of the component supplying devices based on a coordinate position of the reference mark of each of the multiple component supplying devices,
   prioritize a positional correction of a nozzle of the multiple nozzles facing a smallest sized component of the components supplied to the respective component supply positions based on the coordinate position of the center of the smallest sized component,
   correct the position of the multiple nozzles by at least rotating the head based on the positional correction of the nozzle facing the smallest sized component, and
   cause the nozzle lifting and lowering devices facing the respective component supply positions to suction the respective components simultaneously.

2. The component mounting machine according to claim 1,
   wherein the processing circuitry causes the head moving robot to make a predetermined suction position of the nozzle facing the smallest sized component to coincide with a predetermined suctioned position of the smallest sized component.

3. The component mounting machine according to claim 1,
   wherein the head comprises multiple sets of the nozzles facing the respective component supply positions, and
   wherein the processing circuitry positions the nozzles, for each set, so as to face the respective component supply positions, and causes the head moving robot to prioritize the positional correction of the nozzle facing the smallest sized component in the components supplied to the component supply positions with two or more thereof, and cause the nozzle lifting and lowering devices, facing the respective component supply positions with two or more thereof, to suction the respective components simultaneously.

4. The component mounting machine according to claim 1,
   wherein nozzles facing the respective component supply positions with two or more thereof are aligned in a direction at right angles to a direction in which the component supplying devices feed out the component.

5. A component suctioning method for a component mounting machine, the component mounting machine including multiple component supplying devices each configured to feed out a component to a component supply position;
   a head comprising multiple nozzles each configured to suction a component;
   a head moving robot configured to move the head to cause the nozzles to face the respective component supply positions with two or more thereof, a camera on the head moving robot movable with the head, and nozzle lifting and lowering devices each including a motor configured to lift and lower the nozzles facing the respective component supply positions, the component suctioning method comprising:
   positioning the nozzles so as to face the respective component supply positions;
   imaging a reference mark of each of the multiple component supplying devices with the camera,
   determining a coordinate position of a center of the component of each of the component supplying devices based on a coordinate position of the reference mark of each of the multiple component supplying devices,
   prioritizing a positional correction of a nozzle facing a smallest sized component in the components supplied to the component supply positions based on the coordinate position of the center of the smallest sized component;
   correcting the position of the multiple nozzles by at least rotating the head based on the positional correction of the nozzle facing the smallest sized component; and
   causing the nozzles facing the respective component supply positions to suction the respective components simultaneously.

* * * * *